United States Patent [19]

Ooue et al.

[11] Patent Number: 4,651,191
[45] Date of Patent: Mar. 17, 1987

[54] SEMICONDUCTOR DEVICE AND FABRICATION METHOD THEREOF

[75] Inventors: Michio Ooue, Hitachi; Yoko Wakui, Tohkai; Hiroaki Hachino, Hitachi, all of Japan

[73] Assignee: Hitachi, Ltd., Tokyo, Japan

[21] Appl. No.: 880,942

[22] Filed: Jun. 25, 1986

Related U.S. Application Data

[63] Continuation of Ser. No. 413,892, Sep. 1, 1982, abandoned.

[30] Foreign Application Priority Data

Sep. 2, 1981 [JP] Japan .................. 56-137011

[51] Int. Cl.[4] .............. H01L 23/54; H01L 23/48
[52] U.S. Cl. ............................ 357/71; 357/67
[58] Field of Search ............ 357/71, 67, 68, 65, 357/75

[56] References Cited

U.S. PATENT DOCUMENTS 3,401,055  9/1968  Langdon et al. ............. 357/71
3,508,118  4/1970  Merrin et al. ............. 357/71 X
3,839,727 10/1974  Herdzik et al. ............. 357/71

Primary Examiner—Martin H. Edlow
Assistant Examiner—S. V. Clark
Attorney, Agent, or Firm—Antonelli, Terry & Wands

[57] ABSTRACT

Disclosed is a semiconductor device constructed such that among elements forming a brazing material for bonding an electrode on a semiconductor substrate to an external electrode, the amounts of those elements which react with the material of the electrode or external electrode and form a compound harder and more brittle than the electrode material are smaller on the portion coming into contact with the electrode or external electrode than at the other portions. A fabrication method of such a semiconductor device is also disclosed, which method involving the steps of laminating and depositing an at least two-layered metallic layer on the surface of the electrode on the semiconductor substrate or on the surface of the external electrode, bringing the electrodes of the at least two-layered metallic layer into intimate contact with each other while opposing one another, and bonding them together in the presence of the force of pressure applied to both electrodes while they are being heated to a temperature close to an eutectic temperature of an alloy consisting of the metals of the uppermost layer and subsequent layer, immediately therebelow, of the metallic layer.

3 Claims, 10 Drawing Figures

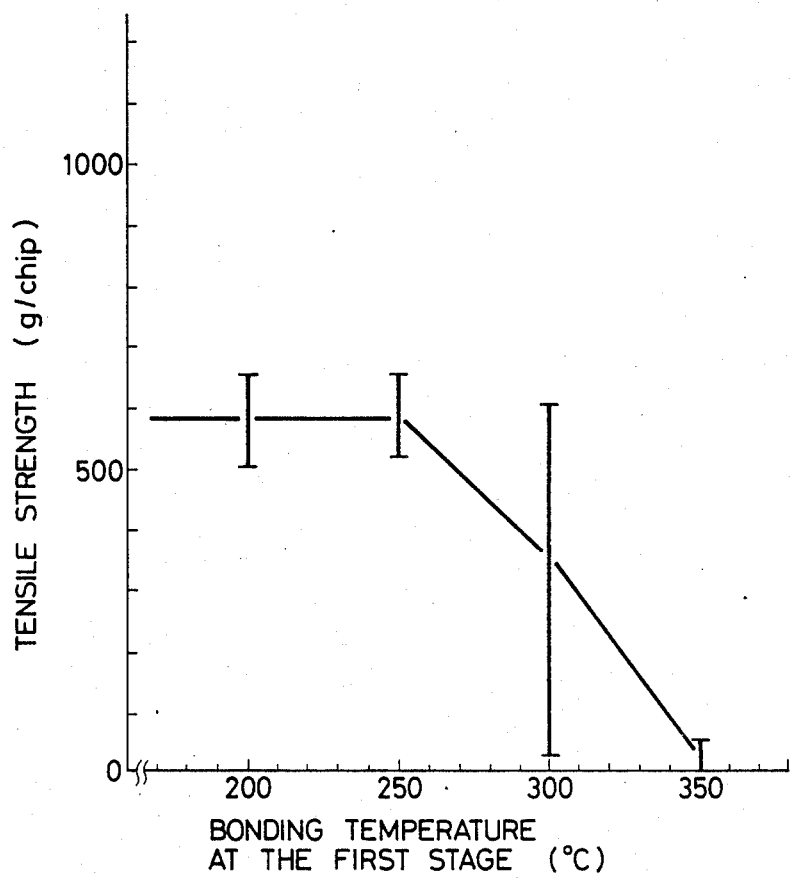

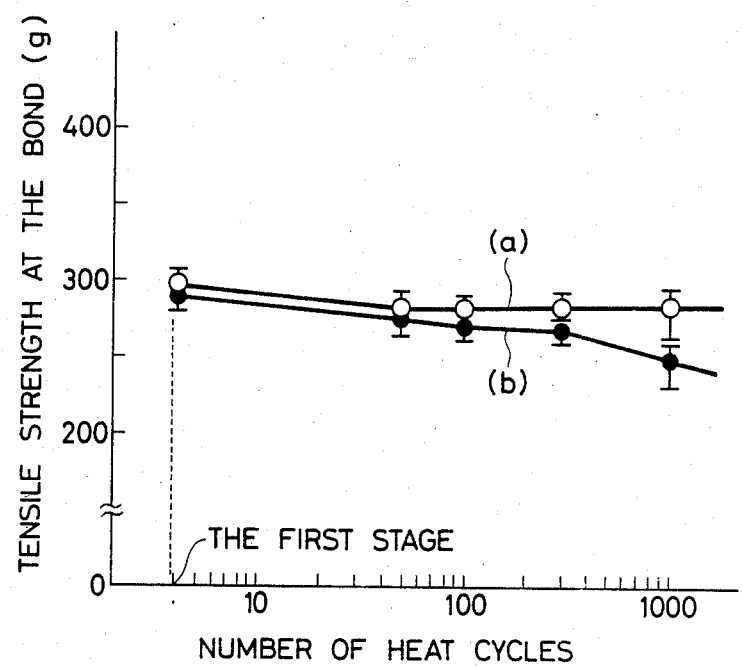

SEMICONDUCTOR DEVICE AND FABRICATION METHOD THEREOF

This application is a continuing application of Ser. No. 413,892, filed Sept. 1, 1982 abandoned.

BACKGROUND OF THE INVENTION

This invention relates to a semiconductor device having external electrode members that are brazed to electrodes formed on a semiconductor substrate, and also to a method of fabricating such a semiconductor device.

Generally, semiconductor devices have electrodes formed at predetermined portions on the surface of a semiconductor substrate and external electrode members for connecting the electrodes to the outside. The shapes of the external electrode members are diversified such as line-like, sheet-like, foil-like, and so forth. When these external electrode members are connected to the electrodes on the semiconductor surface with two-dimensional expansion, these conductive elements are mostly connected to one another by brazing or soldering.

If, in this case, the exothermic quantity on the semiconductor substrate is relatively great for handling relatively large power or for other reasons, a brazing material having a relatively high melting point and high resistance to heat fatigue is used as the brazing material. For instance, it has a composition of 95 wt% Pb and 5 wt% Sn.

However, a problem occurs from time to time that the use of a brazing material having a high melting point fails to satisfy other characteristics of a semiconductor device or characteristics required in fabricating the semiconductor device. This point will be described more definitely.

The inventors of the present invention previously proposed a semiconductor device which uses a metallic foil bonded to a resin tape as the external electrode members. In the semiconductor devices of this kind, the electrodes on the semiconductor substrate and a metallic foil having substantially the same shape as that on the electrodes of the semiconductor substrate are disposed so as to oppose one another via a brazing material and the brazing material is then fused so as to bond the foil and electrodes together. According to this arrangement, the metallic foil supplements the thickness on the electrodes of the semiconductor substrate, reduces the resistance of the electrodes as a whole and increases the current feed quantity even if the electrodes on the semiconductor substrate are thin and micro-small and hence, even if they alone can not provide a sufficient feed current quantity.

If a solder having a high melting point is used for brazing such micro-small electrodes, however, the following problems are yet to be solved in conjunction with the fabrication of the device. First, since the solder having a high melting point has a high treating temperature, the atmosphere for the treatment must be adjusted to be a reducing atmosphere. In a non-reducing atmosphere, the solder and the electrode material on the semi-conductor substrate would be oxidized because the treating temperature is high and a connection having high strength could not be obtained. It has been difficult from the aspect of fabrication of the device to adjust the surrounding atmosphere to a specific type of atmosphere and to connect the electrodes having a micro-small shape at a high temperature with a high level of accuracy.

It has been clarified that even if the above-mentioned problem were solved, another problem develops in that resistance to heat fatigue is not sufficiently high if a connection is made in accordance with the conventional method using the solder having a high melting point. This is clarified by the inventors of the present invention in the course of evaluation of the resistance to heat fatigue. It has been confirmed that the strength of even a solder having a high melting point drops to an unpractical level after a large number of heat cycles are applied to the test-piece.

SUMMARY OF THE INVENTION

It is an object of the present invention to provide a semiconductor device having external electrode members with connecting portions having high resistance to heat fatigue.

The object of the fabrication method of a semiconductor device in accordance with the present invention is to provide a fabrication method of a semiconductor device which method employs a brazing method providing high resistance to heat fatigue, especially a brazing method having high reliability.

One characterizing feature of the present invention resides in that the quantities of those elements, which are contained in a brazing material for connecting the electrodes on the semiconductor substrate to the external electrodes members and which react with the material of the electrode members or external electrodes thereby to form a hard and brittle compound, are smaller at the portion where the brazing material comes into contact with the electrodes or external electrode members than at other portions.

From the aspect of the fabrication method, the present invention is characterized in that an at least two-layered metallic layer is laminated and deposited on the surface of the electrodes on the semiconductor surface or that of the external electrode members, and both the electrodes and the electrode members are opposed one another and are brought into intimate contact with one another via the metallic layer and are then bonded while they are being heated to a temperture near the eutectic temperature of an alloy consisting of the metals of the uppermost layer of the metallic layer and the metals of the layer below the uppermost layer and while force of pressure is being applied to both electrodes and electrode members. The method of the present invention also includes a step of firmly bonding both electrodes and electrode members by applying heat-treatment at a higher temperature than the abovementioned bonding temperature, whenever necessary.

The present invention will be descrived in further detail. In the following description, the electrodes on the semiconductor substrate and the external electrode members will be referred to an "electrode film" and a "metallic foil" respectively, for ease of the explanation.

In the semiconductor apparatus in accordance with the present invention, the metallic foil may be a metal or alloy having high conductivity or a metallic foil obtained by laminating the metal and the alloy. The metallic foil preferably contains at least one of Cu and Ni. The electrode film preferably contains a metal or metals other than Cu and Ni in at least its surface portion. However, the electrode film need not be a single layer but may assume a multi-layered structure in order to improve adhesion between the semiconductor substrate and the electrode film. In this case, metals including Cu or Ni may be used as the metal in the lower layer not appearing on the surface. For instance, the surface portion is made of Ag with the lower layer consisting of a laminate structure of Ni-Cr, Ni-Ti, Cu-Ni-Cr, Cu-Ni-Ti, or the like. It may consist of an alloy layer such as NiCr, NiTi, Cu-NiCr, Cu-NiTi or the like.

The abovementioned metallic foil is bonded to the electrode film by use of a solder layer containing Pb and at least one of Sn, In and Bi. In the present invention, the distribution of Sn, In or Bi in this solder layer is heterogeneous so that the content of Sn, In or Bi is small in the metallic foil while the content of Sn, In or Bi is great in the electrode film.

It has been clarified from the experiments carried out by the inventors of the present invention that when the Cu- or Ni-containing metallic foil is bonded to the electrode film by soldering, the resulting bond is likely to peel off due to heat fatigue and bonding strength is likely to drop to cause inferior bonding when this semiconductor device is subjected to a power cycle test and a heat cycle test. The reasons for the peel and drop of bonding strength are assumed as follows. When the heat cycle or power cycle is applied, a new metallic phase is generated in the region adjacent the metallic foil, the resulting metallic phase is hard and brittle and the formation of this metallic phase changes the composition and structure of the solder layer. It has also been clarified that the Cu- or Ni-containing metallic foil forms the metallic phase together with Sn, In or Bi but does not form the metallic phase with Pb.

When the Cu foil is used as the metallic foil and a Pb-Sn type, a Pb-In type or a Pb-Bi type is used as the solder layer, $Cu_6Sn_5$ and $Cu_3Sn$ are formed in the Pb-Sn system, CuBi is formed in the Pb-In system and $Cu_9In_4$, $Cu_4In$ and $Cu_7In_4$ are formed in the Pb-Bi system. When a Ni-containing foil is used as the metallic foil, $Ni_3Sn_4$, $Ni_3Sn_2$, $Ni_4Sn$ and NiSn are formed in the Pb-Sn system, NiBi is formed in the Pb-Bi system and $In_{27}Ni_{10}$, $In_3Ni_2$, InNi, $InNi_3$ and $InNi_4$ are formed in the Pb-In system.

These metallic phases are formed as Sn, In and Bi diffuse from the solder layer and reach the boundary with the metallic foil along with the application of the heat cycle. It has been found that diffusion is accelerated by the stress of the bond portion arising not only from the temperature condition but also from the mutual difference of expansion coefficients of the bonded matter. This is because the diffusion of these metals is fast in the field of stress.

Next, the method of the present invention will be described in detail.

In accordance with the method of the present invention, the constituent elements of each metal in the solder layer are disposed in a laminar form in a predetermined sequence on the electrode film or the metallic foil so as to attain a desired solder composition when the final heat-treatment is effected. In this case, the elements are arranged such that an eutectic composition is partially formed between the uppermost layer and the next layer with respect to the direction of lamination. Next, the electrode film and the metallic foil are opposed to each other and the eutectic reaction is carried out between the uppermost layer and the next layer to form a fusing solution at that portion. Under this state, both electrode film and metallic foil are pressurized and are heat-bonded under pressure by means of the fusing solution of the abovementioned eutectic composition. In this manner, the electrode film and the metallic foil can be continuously bonded at a relatively low temperature with ease of fabrication. Since the treating temperature at the time of bonding is low, oxidation of the members and solder hardly occurs and the atmosphere for the treatment may be sufficiently established by spraying a gas having low reducing power such as $N_2$ or Ar to the bonding portion.

The abovementioned bonding step alone can provide sufficiently high bonding strength, but in order to obtain a brazing layer having a solder composition of a high melting point, the brazing material layer is as a whole heated and turned into a fusing solution at a temperature higher than the melting point each of the uppermost layer and subsequent metallic layers so that the metals of the uppermost and subsequent layers are mutually diffused to form an alloy layer. In this case, since the electrode film and the metallic foil are already bonded mechanically sufficiently, mutual deviation can be prevented without applying any load or by applying a low load to the bonded portion.

The distribution of each element in the abovementioned alloy is determined by the diffusion phenomenon of each element at the time of second heating. If those elements which form the hard and brittle alloy phase with Cu or Ni are arranged in advance so that they do not come into direct contact with the Cu or Ni containing member, the formation of the alloy phase in the proximity of the Cu or Ni containing member is limited to the quantities of the elements that are diffused to this portion.

BRIEF DESCRIPTION OF THE DRAWINGS

FIGS. 5 and 6 are diagrams that are useful for explaining the effects of one embodiment of the present invention.

DESCRIPTION OF THE PREFERRED EMBODIMENTS

Hereinafter, preferred embodiments of the present invention will be described.

Figure 1A:
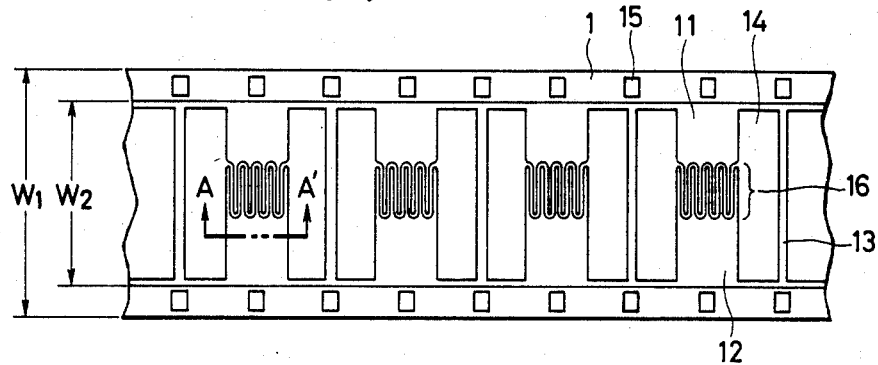
FIG. 1 illustrates a composite electrode member to be used in one embodiment of the present invention.
Figure 1B:
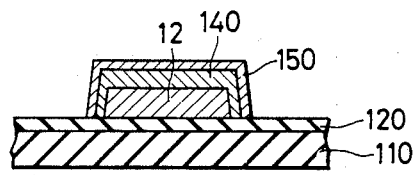

FIG. 1(a) is a plan view of the composite electrode arrangement to be used in one embodiment of the present invention and FIG. 1(b) is an enlarged sectional view of the electrode arrangement taken along line A—A' of FIG. 1(a). In FIG. 1, the composite electrode arrangement 1 is obtained by bonding a 35 μm thick copper foil 10 having a width $W_2$ of 25 mm to a 75 μm thick polyimide tape 110 having a width $W_1$ of 35 mm by use of an epoxy type adhesive 120 and then etching the copper foil in a predetermined pattern which is shown in FIG. 1a. The pattern of the copper foil 10 is such that a pair of external electrode members 11, 12 and a bridge portion 13 to electrically short-circuit the pair of external electrode members are repeated in the longitudinal direction of the copper foil. Accordingly, the region represented by reference numeral 14 in FIG. 1(a) does not exist. Reference numeral 15 represents punch holes (perforations) for feeding the tape. Portions 16 at which the electrode member 11 and 12 engage with each other in the comb-like shape represent the electrode connecting portions which are to be bonded to the electrodes on the semiconductor substrate.

As shown in FIG. 1(b), a Pb layer 140 and an An layer 150 are formed on this copper foil pattern in predetermined thickness by electro-plating. The Pb layer 140 is 18 μm to 20 μm thick while the Sn layer 150 is 1 μm to 3 μm thick. In performing the electro-plating, the abovementioned bridge portion 13 plays the part of reducing the number of electrode connecting portions to the copper foil.

Figure 2A:
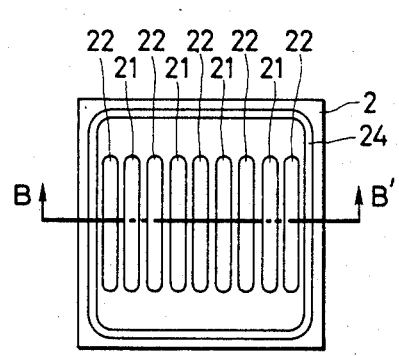
FIG. 2 illustrates a gate turn-off (GTO) thyristor to which one embodiment of the present invention is applied.
Figure 2B:
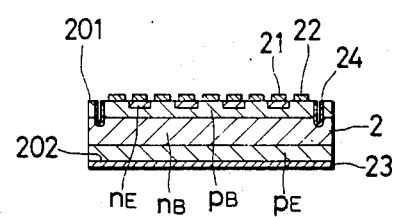

The composite electrode arrangement 1 in which the copper foil is shaped in a predetermined pattern in accordance with the abovementioned method is used as the cathode external electrode member and gate external electrode member of a gate turn-off (GTO) thyristor in this embodiment. FIG. 2 shows the structure of the GTO thyristor used in this embodiment. FIG. 2(d) is a plan view and 2(b) is a sectional view taken along line B—B' of 2(a). In this GTO thyristor, both cathode and gate electrodes 21 and 22 are divided into a plurality of segments and they are alternately formed on one main surface 201 of the semiconductor substrate 2. The semiconductor substrate 2 consists of a p-type emitter layer pE (or anode layer), an n-type base layer nB, p-type base layer pB (or gate layer) and an n-type emitter layer nE (or cathode layer). The four layers extend from one main surface 201 of the semiconductor substrate 2 to the other main surface 202 thereof. A groove 24 is defined around the peripheral portion of one main surface 201 and glass for passivation is packed into the groove 24. An anode electrode 23 is formed over the entire surface of the other main surface 202.

The cathode electrode 21, the gate electrode 22 and the anode electrode 23 can be soldered and use a metallic electrode film that satisfies the requirements such as high ohmic contact with p- and n-type silicon, good adhesion with the semiconductor substrate, low resistivity, and so forth. In this embodiment, a Cr-Ni-Ag multi-layered metallic electrode film is used and the cathode electrode 21 as well as the gate electrode 22 are formed by lift-off process.

Figure 3A:
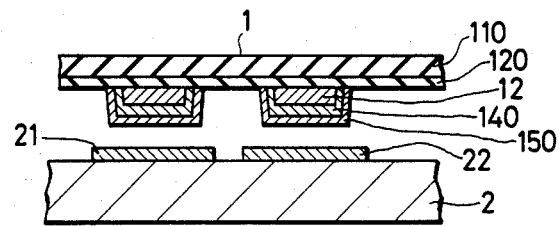
FIG. 3 diagrammatically illustrates the production steps in accordance with one embodiment of the present invention.
Figure 3B:
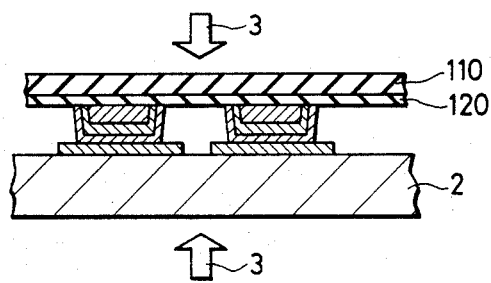

The composite electrode arrangement 1 and the GTO thyristor are connected in the following manner with reference to FIG. 3. As shown in FIG. 3(a), the composite electrode arrangement 1 and the GTO thyristor are disposed in parallel with each other so that the Sn layer 150 of the former and the cathode and gate electrodes 21, 22 of the latter face each other. The cathode and gate electrode foils 11 and 12 of the composite electrode arrangement 1 are then registered with the patterns of the cathode and gate electrodes 21 and 22 of the GTO thyristor while observing through an optical microscope. Thereafter, the GTO thyristor and the composite electrode arrangement 1 are heated to 190° C. to 300° C. as shown in FIG. 3(b) and are bonded to each other. In this instance, a pressure of 0.1 to 100 g/cm² is applied to the GTO thyristor and to the composite electrode arrangement 1 in the direction indicated by an arrow 3. It is preferred that an inert gas such as N₂ or Ar be blown to the bonding portion between the GTO thyristor and the composite electrode arrangement 1 during bonding. As a result, a Pb-Sn alloy layer 310 is formed in the interface between the Pb layer 140 and Sn layer 150 as shown in FIG. 3b.

Figure 3C:
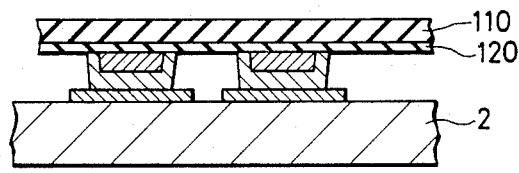

Next, the unitary structure of the GTO thyristor and the composite electrode member 1 is further heated as shown in FIG. 3(c) in order to mutually diffuse the Pb layer and the Pb-Sn alloy layer 310 having the eutectic composition. Under the state in which a load is being applied, this heating is effected at a temperature ranging from 330° to 360° C. in the atmosphere of a reducing gas. The polyimide film 110 together with the epoxy type adhesive 120 are peeled off from the copper foil 10 after this heat-treatment. As a result, a Pb-Sn alloy layer 320 having a relatively high Sn concentration on the side of the alloy layer adjacent the cathode electrode 21 on the semiconductor substrate 2 and the gate electrode 22, and a relatively low Sn concentration on the side of the electrode of the composite electrode arrangement 1, is formed.

Figure 4:
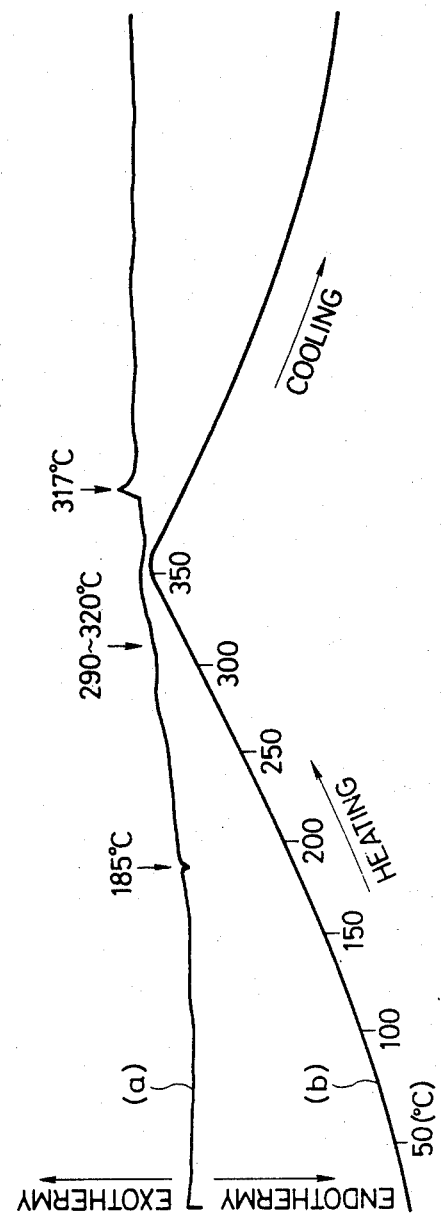
FIG. 4 is a DTA diagram in the fabrication method of one embodiment of the present invention.

FIG. 4 illustrates the results of differential thermal analysis of the brazing material at the bond in the series of steps shown in FIG. 3. Symbol (a) represents a differential thermal analysis (DTA) curve while (b) represents a temperature. It can be seen from FIG. 4 that along with heating, endothermy by the eutectic reaction between Pb and Sn is observed at about 185° C. and if heating is further effected, the slow endothermic reaction develops at a temperature ranging from 290° C. to 320° C. It can be also seen that the endothermic reaction occurs at a temperature in the range of from 300° to 320° C. at the time of cooling. The endothermic reaction at 290° to 320° C. results from fusing of the Pb and Sn layers and the endothermic reaction at 300° to 320° C. results from solidification of Pb-Sn solder.

The heating temperature of bonding at the first stage in this embodiment (FIG. 3(b)) is preferably from 190° to 250° C. The most suitable temperature is in the proximity of the eutectic reaction. If the temperature of bonding at the first stage exceeds 250° C., the resulting eutectic crystal further reacts with the Pb layer, forming a diffusion layer. If the crystal grains are large as in the case in which the Pb layer is formed by the plating method, the diffusion layer is preferentially formed to the intercrystalline boundary of the crystal grains so that the crystal grains become easily separable and hence, bonding strength is reduced.

FIG. 5 illustrates tensile strength at the bond after bonding of FIG. 3(b) is applied between the composite electrode member 1 and the GTO thyristor at various temperatures. The highest bonding strength can be obtained when the bonding temperature is within the range from a point close to the eutectic temperature (183° C.) of Pb and Sn to about 250° C. When the temperature exceeds 250° C., high bonding strength can no longer be obtained. Moreover, variance in bonding strength becomes greater, thus reducing the yield.

In the first bonding step, heating to a predetermined temperature and pressurization of the bonding portion are effected as described already. The object of pressurization is to bring the Pb-Sn eutectic crystal, that occurs at the boundary between the Pb layer 140 and the Sn layer 150 at the first bonding step, into contact with the electrodes 21 and 22 of the GTO thyristor. The force of pressurization varies depending upon the surface smoothness of the Pb layer 140, the thickness of the Sn layer and the like but it is from one to ten of g/cm². This is the pressure that withstands the viscosity of the solder solution of the eutectic composition formed on the interface between the Pb and Sn layers. Accordingly, the force of pressurization is selected in accordance with the solder composition employed.

The unitary structure of the GTO thyristor and the electrode plate connected to each other by the abovementioned method is subjected to a heat cycle test using −55° C. (for 25 minutes)-room temperature (5 minutes)-150° C. (25 minutes)-room temperature (5 minutes) as one cycle. The results are shown in FIG. 6. In this drawing, (a) represents the results of this embodiment and (b), those of a comparative example. As the comparative example, a bonded structure of the composite electrode member 1 and the GTO thyristor in accordance with the conventional method using a homogeneous composition of 95 wt% Pb and 5 wt% Sn is used.

It can be seen from FIG. 6 that tensile strength drops gradually with an increasing number of heat cycles in the comparative example (b) but the rate of drop is smaller in (a) than in (b). This tendency becomes more remarkable when the number of heat cycles increases. It can be thus appreciated that the semiconductor device in accordance with the present invention has higher resistance to heat fatigue. The reason why such a result can be obtained is that a hard and brittle metallic phase can not easily be formed at the boundary between the solder and the metal to be bonded in accordance with the present invention, as described already. More definitely, in this embodiment, the Pb layer 140 is interposed between the copper electrodes 11, 12 and the Sn layer 150 before bonding, and Sn diffuses into the Pb layer and reaches the adjacent portions of the electrodes 11 and 12 during bonding, especially by the second heat-treatment. In this process, the amount of Sn reaching the adjacent portions of the electrodes 11 and 12 is smaller in comparison with the case in which the conventional solder having the uniform distribution of Pb and Sn in advance is employed. For this reason, this embodiment provides higher resistance to heat fatigue.

In the abovementioned embodiment, methods of heating the bonding portion between the composite electrode member 1 and the GTO thyristor include a method which disposes a heating mechanism on a bed for supporting the GTO thyristor, a method which heats the composite electrode member 1 from above its upper surface using an infrared ray converging lamp or heat blocks, and so forth.

The abovementioned embodiment can be modified in various manners. First, polyester tapes, glass epoxy tapes and the like may be used in place of the polyimide tape 110. An imide type adhesive may be used in place of the epoxy type adhesive 120. An Fe-Ni type alloy foil may be used in place of the copper foil.

Pb rich layer containing at least one of Sn, In, Bi, Ag or the like as the simple substance may be used in place of the Pb layer 140. Furthermore, In, Bi or the like and the simple substance, alloys of Sn with these elements or alloys of Pb with these elements may be used in place of the Sn layer 150. An alloy having a substantially eutectic composition prepared in advance may be used at this portion.

These metallic layers can be formed by various methods such as electrolytic wet plating, chemical wet plating, evaporation, dry plating, ion plating, spattering, and the like. The solder layer may be 1 to 100 μm thick. If the solder layer is a two-layered structure and consists of a Pb type solder as in the abovementioned embodiment, the thickness of the Pb layer 140 and Sn, In or Bi layer 150 is selected such that the atomic ratios Pb/Sn, Pb/In and Pb/Bi after bonding become 99.5/0.5 to 70/30, 99.5/0.5 to 50/50 and 99.5/0.5 to 30/70 respectively.

If Ag, Ni or the like is deposited on the copper foil bonded to the composite electrode member and the solder material layer is then formed thereon, wettability with respect to the solder material can be preferably improved.

Although the foregoing description deals with the example in which the present invention is applied to the GTO thyristor having the micro-small electrode structure, the present invention is not particularly limited thereto but can be of course applied to all the fields of semiconductor devices.

As described in the foregoing, the present invention is effective in obtaining a semiconductor device having external electrode connecting portions having high resistance to heat fatigue. The present invention is also effective in fabricating the semiconductor device with an improved ease for working and with a higher level of reliability.

What is claimed is:

1. In a semiconductor device including a semiconductor substrate; electrodes ohmic-connected to predetermined surface portions of said semiconductor substrate; and external electrode members of an electrically conductive material selected from the group consisting of Cu, Ni and alloys thereof, conductively bonded to said electrodes via a solder material layer, said solder material layer containing Pb as a first solder material and a second solder material of at least one substance selected from the group consisting of Sn, In, Bi and alloys thereof, said solder material layer extending in a direction from the external electrode members to said electrodes; the improvement wherein the second solder material is heterogeneously distributed through the solder material layer in said direction from the external electrode members to said electrodes, and wherein amounts of the second solder material in portions of the solder material layer adjacent said external electrode members are less than amounts of the second solder material in the other portions of the solder material layer, whereby formation of a reaction product of said electrically conductive material of the external electrode members and said second solder material, which reaction product has a metallic phase harder than the external electrode members, is reduced as compared with formation of said reaction product where increased amounts of the second solder material are in the portions of the solder material layer adjacent said external electrode members.

2. The semiconductor device as defined in claim 1 wherein said external electrode members are formed of Cu, said solder material layer comprises a two-layered structure, one layer comprising Pb and the other layer comprising Sn, and said electrodes on said semiconductor substrate are formed of a Cr-Ni-Ag multi-layered metallic film.

3. The semiconductor device as defined in claim 1, wherein each of said external electrode members comprises (1) a plurality of electrode connecting portions, each electrode connecting portion having substantially the same shape as that of a respective electrode ohmic-connecting to said semiconductor substrate, and (2) an external connecting portion common to the plurality of electrode connecting portions.

* * * * *